United States Patent
Noshiro

(10) Patent No.: US 8,811,058 B2
(45) Date of Patent: Aug. 19, 2014

(54) RESISTANCE CHANGE ELEMENT, METHOD FOR MANUFACTURING THE SAME, AND SEMICONDUCTOR MEMORY

(75) Inventor: Hideyuki Noshiro, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 201 days.

(21) Appl. No.: 12/511,722

(22) Filed: Jul. 29, 2009

(65) Prior Publication Data
US 2010/0027319 A1 Feb. 4, 2010

(30) Foreign Application Priority Data

Aug. 1, 2008 (JP) .................................. 2008-199954

(51) Int. Cl.
*G11C 11/00* (2006.01)
*H01L 45/00* (2006.01)
*H01L 27/24* (2006.01)
*G11C 13/00* (2006.01)

(52) U.S. Cl.
CPC .......... *G11C 13/003* (2013.01); *G11C 2213/34* (2013.01); *H01L 45/146* (2013.01); *H01L 27/2463* (2013.01); *H01L 45/1226* (2013.01); *G11C 2213/79* (2013.01); *H01L 27/2436* (2013.01); *G11C 13/0007* (2013.01); *H01L 45/1633* (2013.01); *H01L 45/1233* (2013.01); *G11C 2213/32* (2013.01); *H01L 45/04* (2013.01); *G11C 2213/78* (2013.01); *G11C 13/0069* (2013.01); *G11C 2013/0083* (2013.01)
USPC ........... 365/148; 365/158; 365/163; 365/161; 365/171; 365/173

(58) Field of Classification Search
USPC ......... 365/148, 100, 158, 159, 161, 163, 113, 365/171, 173
See application file for complete search history.

(56) References Cited

U.S. PATENT DOCUMENTS

| | | | |
|---|---|---|---|
| 6,172,903 B1 * | 1/2001 | Nishimura | 365/158 |
| 6,879,475 B2 * | 4/2005 | Kishi et al. | 360/324.2 |
| 7,391,664 B2 * | 6/2008 | Parkinson et al. | 365/222 |
| 8,134,860 B2 * | 3/2012 | Wicker | 365/148 |
| 8,184,410 B2 * | 5/2012 | Fuji et al. | 360/324.12 |
| 2005/0195532 A1 * | 9/2005 | Sugiyama et al. | 360/322 |
| 2006/0081962 A1 | 4/2006 | Wei et al. | |
| 2006/0215445 A1 | 9/2006 | Baek et al. | |

(Continued)

FOREIGN PATENT DOCUMENTS

JP 2006-120702 A 5/2006
JP 2006-279042 A 10/2006

(Continued)

OTHER PUBLICATIONS

"Japanese Office Action" mailed by JPO and corresponding to Japanese application No. 2008-199954 on May 7, 2013, with partial English translation.

*Primary Examiner* — Kretelia Graham
(74) *Attorney, Agent, or Firm* — Fujitsu Patent Center

(57) ABSTRACT

A resistance change element including a first electrode; a second electrode; and an oxide film, including an oxide of the first electrode, formed at sides of the first electrode and sandwiched between the first electrode and the second electrode in a plurality of regions, wherein at least one of the regions includes a resistance part whose resistance value changes in accordance with a voltage applied to the first and second electrodes.

13 Claims, 19 Drawing Sheets

(56) References Cited

U.S. PATENT DOCUMENTS

| | | | |
|---|---|---|---|
| 2007/0240995 A1* | 10/2007 | Odagawa et al. | 205/183 |
| 2008/0128853 A1* | 6/2008 | Choi et al. | 257/530 |
| 2008/0247219 A1* | 10/2008 | Choi et al. | 365/148 |
| 2008/0278989 A1* | 11/2008 | Lee et al. | 365/148 |
| 2009/0174519 A1* | 7/2009 | Mikawa et al. | 338/20 |
| 2009/0184305 A1* | 7/2009 | Lee et al. | 257/2 |
| 2009/0257271 A1 | 10/2009 | Noshiro | |

FOREIGN PATENT DOCUMENTS

| | | |
|---|---|---|
| JP | 2007-294998 | 11/2007 |
| WO | WO-2007/116749 | 10/2007 |
| WO | WO-2008/075471 | 6/2008 |

* cited by examiner

US 8,811,058 B2

RESISTANCE CHANGE ELEMENT, METHOD FOR MANUFACTURING THE SAME, AND SEMICONDUCTOR MEMORY

CROSS-REFERENCE TO RELATED APPLICATIONS

This application is based upon and claims the benefit of priority from prior Japanese Patent Application No. 2008-199954, filed on Aug. 1, 2008, the entire contents of which are incorporated herein by reference.

FIELD

The embodiments discussed herein are related to a resistance change element, a method for manufacturing the resistance change element, and a semiconductor memory including the resistance change element.

BACKGROUND

In recent years, resistance change elements that utilize changes in a resistance value to store data have been proposed (see, for example, Japanese Laid-Open Patent Publication No. 2006-120702 and Japanese Laid-Open Patent Publication No. 2006-279042). A non-volatile Resistive Random Access Memory (ReRAM) where the resistance change elements are used for a memory cell has also been developed. Generally, such resistance change elements undergo a process called forming (hereinafter, referred to as a "forming process") after having been manufactured so that the resistance values of the resistance change elements may enter a high-resistance state or a low-resistance state. In the forming process, a voltage is applied to both electrodes until the resistance change element experiences breakdown. The breakdown allows a resistance part to be formed in the resistance change element. After the breakdown, the resistance value of the resistance part may change when a given voltage is applied to both of the electrodes of the resistance change element.

A value of a voltage for the forming process (hereinafter, referred to as a "forming voltage") differs depending on a resistance change element and tends to have variations. Therefore, the value of the voltage to be applied to resistance change elements is set in accordance with the resistance change element that employs the highest forming voltage. However, use of a high voltage for the forming process may cause damage to the resistance change elements.

SUMMARY

Accordingly, it is an object in one aspect of the invention to provide a resistance change element including a first electrode; a second electrode; and an oxide film, including an oxide of the first electrode, formed at sides of the first electrode and sandwiched between the first electrode and the second electrode in a plurality of regions, wherein at least one of the regions includes a resistance part whose resistance value changes in accordance with a voltage applied to the first and second electrodes.

The object and advantages of the concepts discussed herein will be realized and attained by means of the elements and combinations particularly pointed out in the claims.

It is to be understood that both the foregoing general description and the following detailed description are exemplary and explanatory and are not restrictive of the concepts, as claimed.

DESCRIPTION OF EMBODIMENTS

Figure 1:
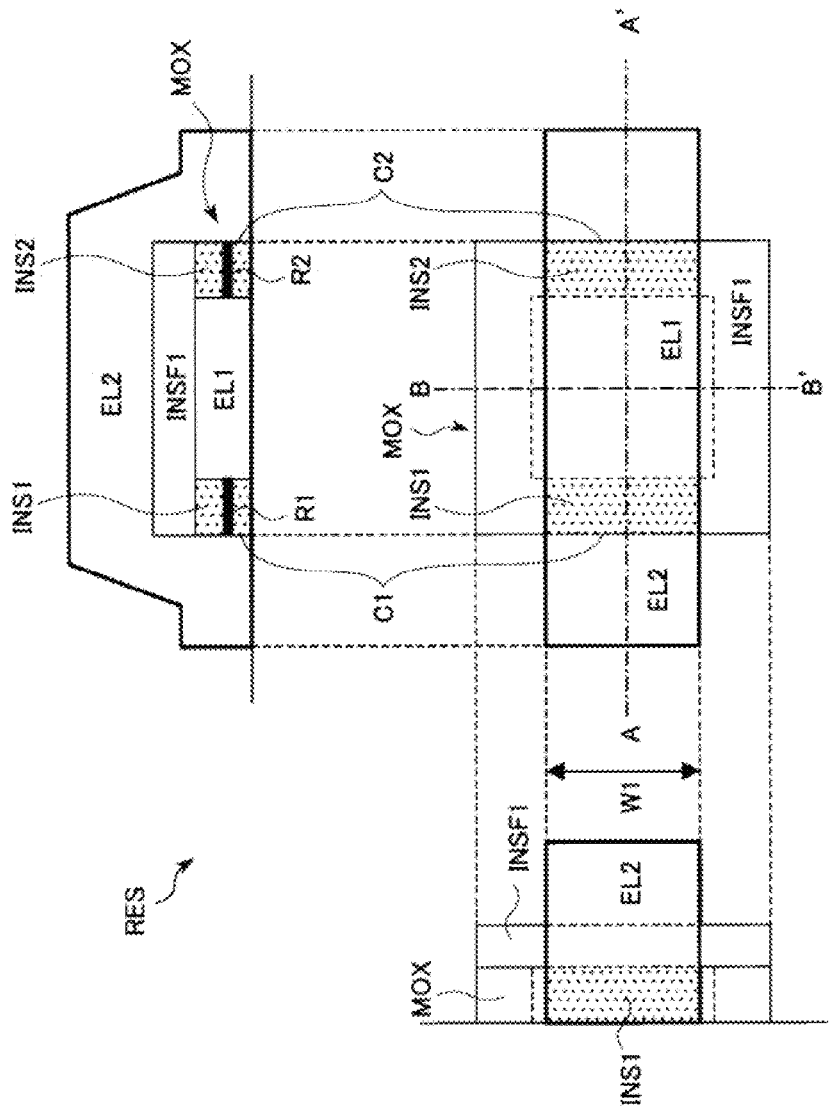
FIG. 1 illustrates a resistance change element according to an embodiment.

FIG. 1 illustrates a resistance change element RES according to an embodiment. The cross sectional view on the upper side of FIG. 1 illustrates a cross section along the A-A' line in the plan view of the resistance change element RES. The cross sectional view on the left side of FIG. 1 illustrates a cross section along the B-B' line in the plan view of the resistance change element RES.

For example, the resistance change element RES includes a bottom electrode pattern EL1 including, for example, nickel (Ni), a metal oxide MOX including, for example, a nickel dioxide ($NiO_2$), and a top electrode pattern EL2 including, for example, platinum (Pt). The metal oxide MOX is formed on the periphery of the bottom electrode pattern EL1. The top electrode pattern EL2 is disposed to cover the bottom electrode pattern EL1 and the metal oxide MOX. The top electrode pattern EL1 and bottom electrode pattern EL2 are electrically insulated by an insulating film INSF1 including, for example, silicon dioxide. Hereinafter, the bottom and top electrode patterns EL1 and EL2 are referred to also as the bottom and top electrodes EL1 and EL2.

The bottom electrode EL1 is not limited to nickel and may include at least one transition metal, such as titanium, vanadium, manganese, iron, cobalt, copper, yttrium, zirconium, niobium, molybdenum, hafnium, tantalum, or tungsten, or may include zinc. The metal oxide MOX is not limited to a nickel oxide and may be an oxide of the above-described transition metals or an oxide of zinc.

For example, a wiring width W1 of the top electrode pattern EL2 may be smaller than the length of one of the sides of the bottom electrode pattern EL1 as depicted in FIG. 1. The wiring width W1 of the top electrode pattern EL2 may be smaller than the length of one of the sides of the insulating film INSF1. The top electrode EL2 is coupled through two contact parts C1 and C2 of the metal oxide MOX to the bottom electrode EL1. The contact parts C1 and C2 are located at the side walls of the metal oxide MOX and are electrically isolated from each other. An insulating part INS1 is formed between the contact part C1 and the bottom electrode EL1. An insulating part INS2 is formed between the contact part C2 and the bottom electrode EL1. That is, the insulating parts INS1 and INS2 are disposed in parallel between the bottom electrode EL1 and the top electrode EL2. Either the insulating part INS1 or the insulating part INS2 has a resistance part R1 or R2 that is formed through a breakdown caused by a forming process to be described later. To simplify the explanation, FIG. 1 illustrates both of the resistance parts R1 and R2.

FIGS. 2A to 2D illustrate a method for manufacturing the resistance change element RES in FIG. 1. Each of the cross sectional views in FIGS. 2A to 2D illustrates a cross section along the A-A' line in FIG. 1. For example, the resistance change element RES is formed on an interlayer insulating film IINS1.

Figure 2A:
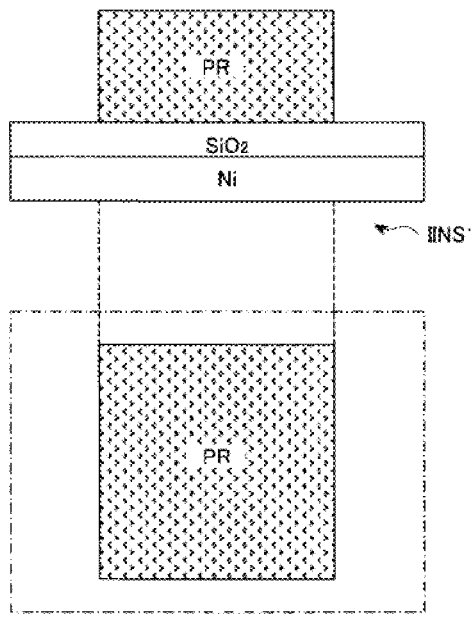
FIGS. 2A to 2D illustrate a method for manufacturing the resistance change element in FIG. 1.
Figure 2B:
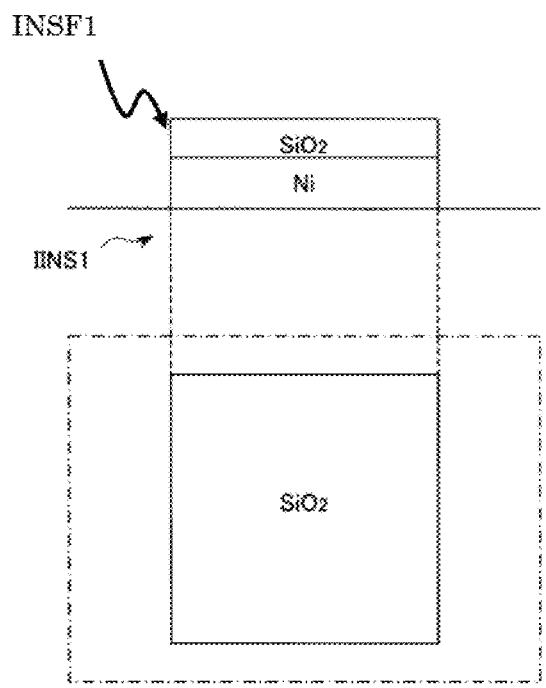

As illustrated in FIG. 2A, a nickel film Ni is formed on the interlayer insulating film IINS1 by, for example, sputtering. An insulating film $SiO_2$, is deposited on the nickel film Ni by, for example, Chemical Vapor Deposition (CVD). A photoresist PR is selectively formed on the insulating film $SiO_2$. Then, as illustrated in FIG. 2B, the insulating film $SiO_2$ and the nickel film Ni are selectively removed by photolithography and dry etching. The resist PR is removed thereafter. As illustrated in FIG. 2B, the side walls of the nickel film Ni are exposed since the top and bottom surfaces of the nickel film Ni are in contact with the insulating films INSF1 and IINS1.

Figure 2C:
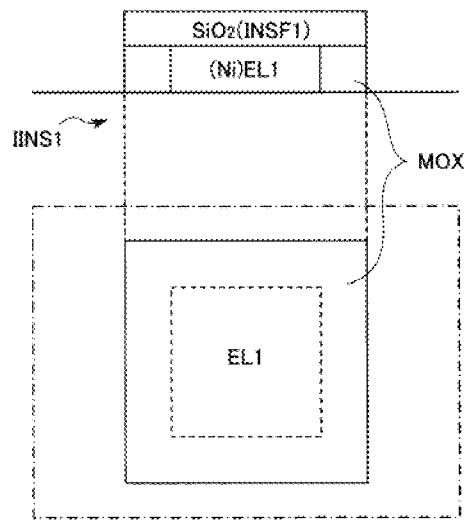
Figure 2D:
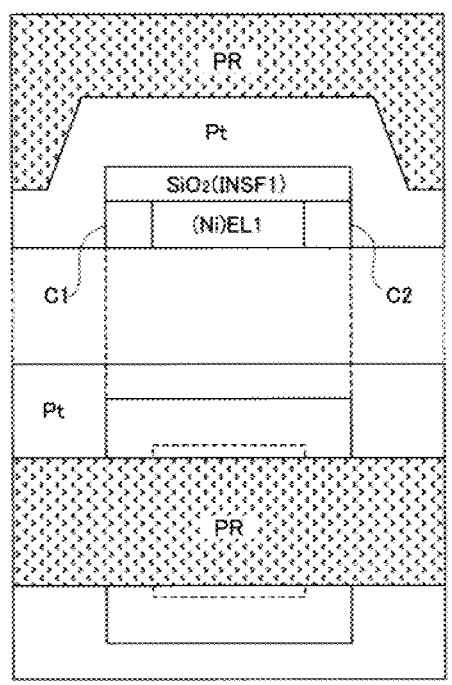

Referring to FIG. 2C, heat treatment is performed in an oxygen atmosphere. By the heat treatment, the nickel film Ni is gradually oxidized from the side walls to form the metal oxide MOX (for example, nickel oxide) on the periphery of the bottom electrode EL1. As illustrated in FIG. 2D, a conductive film including, for example, platinum (Pt) is formed to cover the interlayer insulating film IINS1, the insulating film INSF1, and the side surfaces of the metal oxide MOX by, for example, sputtering. Then, a photoresist PR is selectively formed on the conductive film. After that, the conductive film Pt is selectively removed to form the top electrode EL2 illustrated in FIG. 1 by photolithography and dry etching. The photoresist PR is removed thereafter.

Next, the forming process is performed by applying a voltage of, for example, 3.5 V between the bottom electrode EL1 and the top electrode EL2. As a result, either the insulating part INS1 or the insulating part INS2 undergoes the breakdown to form the resistance part R1 or R2. That is, the resistance part R1 or R2 is formed in either the insulating part INS1 or the insulating part INS2 that has a lower withstand pressure. According to the present embodiment, the value of the forming voltage may be set depending on the insulating part that has a lower withstand pressure. As a result, the forming process is more likely to be performed with a lower voltage.

The forming process as used herein means to apply a voltage between the bottom electrode EL1 and the top electrode EL2 of the resistance change element RES after the formation of the resistance change element RES. The forming process causes the breakdown of the metal oxide MOX. Thereby, the resistance value of the resistance change element RES transitions from a high-resistance state to a low-resistance state. After the forming process, the resistance value of the resistance change element RES transitions from the low-resistance state to the high-resistance state or from the high-resistance state to the low-resistance state every time a given voltage is applied between the bottom electrode EL1 and the top electrode EL2. For example, in the low-resistance state, the resistance part R1 or R2 has the resistance value of a few kΩ. For example, in the high-resistance state, the resistance part R1 or R2 has the resistance value of 10 kΩ to 1000 kΩ.

Figure 3:
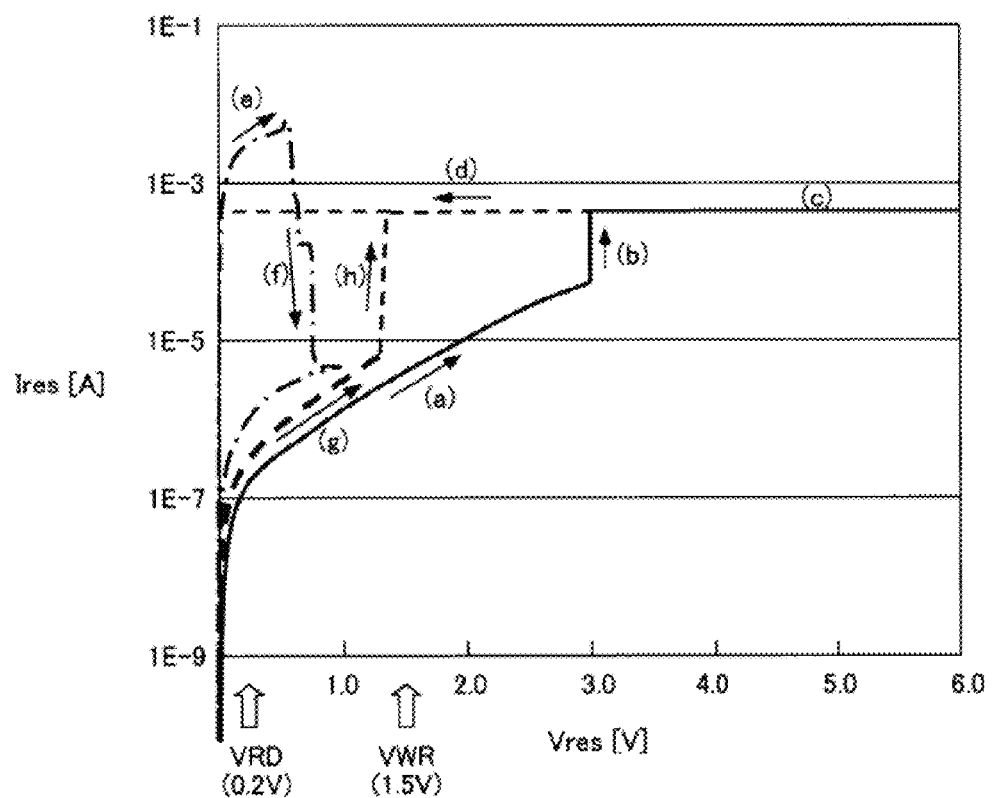
FIG. 3 is a graph illustrating characteristics of the resistance change element in FIG. 1.

FIG. 3 is a graph illustrating characteristics of the resistance change element RES in FIG. 1. The boldface solid line represents changes in the characteristics during the forming process. The boldface dashed-dotted line represents changes in the characteristics during the transition from the low-resistance state to the high-resistance state after the forming process. The boldface dashed line represents changes in the characteristics during the transition from the high-resistance state to the low-resistance state after the forming process.

First, in the forming process, a current Ires that flows between the bottom electrode EL1 and the top electrode EL2 gradually increases as a voltage Vres applied between the bottom electrode EL1 and the top electrode EL2 increases (see (a) in FIG. 3). In the example illustrated in FIG. 3, either the insulating part INS1 or the insulating part INS2 undergoes the breakdown and the current Ires sharply increases when the voltage Vres is 3 V (see (b) in FIG. 3). For example, the current Ires is controlled with a limiter circuit provided to a unit for applying the voltage Vres so as not to exceed a given value of, for example, 0.5 mA (see (c) in FIG. 3). In this way, destruction of the resistance change element RES may be prevented. The resistance part R1 or R2 formed through the breakdown enters the low-resistance state (set state) (see (d) in FIG. 3).

When the resistance value of the resistance part R1 or R2 is desired to transition from the low-resistance state to the high-resistance state, the voltage Vres of, for example, approximately 1 V is applied between the bottom electrode EL1 and the top electrode EL2. Then, the current Ires increases (see (e) in FIG. 3) and then decreases (see (f) in FIG. 3). That is, the resistance part R1 or R2 transitions from the low-resistance state to the high-resistance state (reset state). The transition from the low-resistance state to the high-resistance state is referred to also as reset operation hereinafter.

When the resistance value of the resistance part R1 or R2 is desired to transition from the high-resistance state to the low-resistance state, the voltage Vres of, for example, approximately 1.3 V is applied between the bottom electrode EL1 and the top electrode EL2. Then, the current Ires increases as gradually, as when the forming process is performed (see (g) in FIG. 3), and increases sharply at, for example, approximately 1.3 V (see (h) in FIG. 3). For example, the current Ires may be controlled with the limiter circuit so as not to exceed a given value. After that, the resistance part R1 or R2 transitions from the high-resistance state to the low-resistance state (set state). The transition from the high-resistance state to the low-resistance state is referred to also as a set operation hereinafter.

Figure 5:
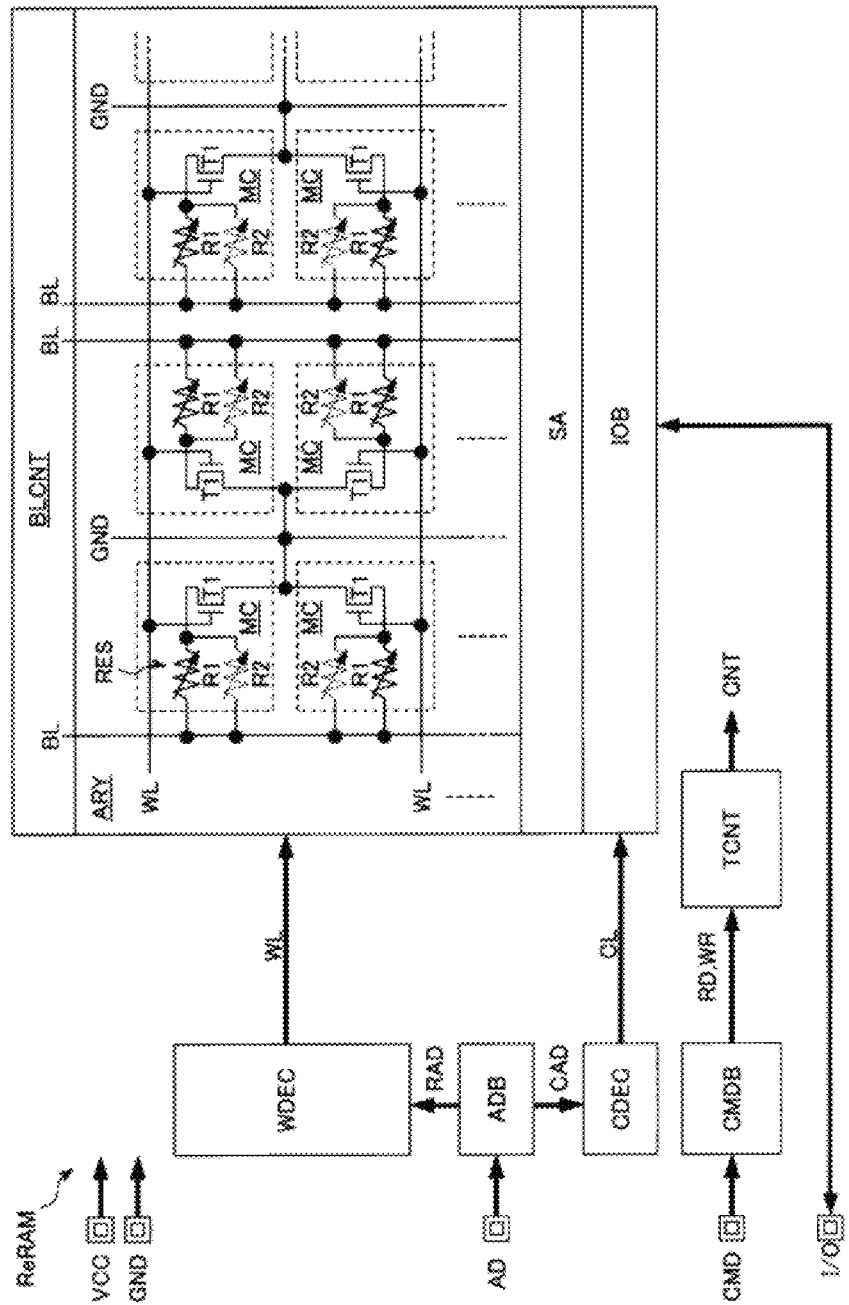
FIG. 5 illustrates a semiconductor memory where the resistance change element in FIG. 1 is mounted.

A voltage VRD in FIG. 3 being, for example, 0.2 V represents a voltage applied between the bottom electrode EL1 and the top electrode EL2 at the time of a reading operation of a semiconductor memory ReRAM in FIG. 5. A voltage VWR being, for example, 1.5 V represents a voltage applied between the bottom electrode EL1 and the top electrode EL2 at the time of a writing operation of the semiconductor memory ReRAM. When the voltage VRD is applied to the resistance part R1 or R2 in the low-resistance state, a relatively large current flows at the resistance part R1 or R2. When the voltage VRD is applied to the resistance part in the high-resistance state, a relatively small current flows at the resistance part R1 or R2. The resistance value of the resistance part R1 or R2 remains substantially unchanged even after the application of the voltage VRD. On the other hand, when the voltage VWR is applied to the resistance part R1 or R2, the resistance state transitions to another resistance state.

Figure 4:
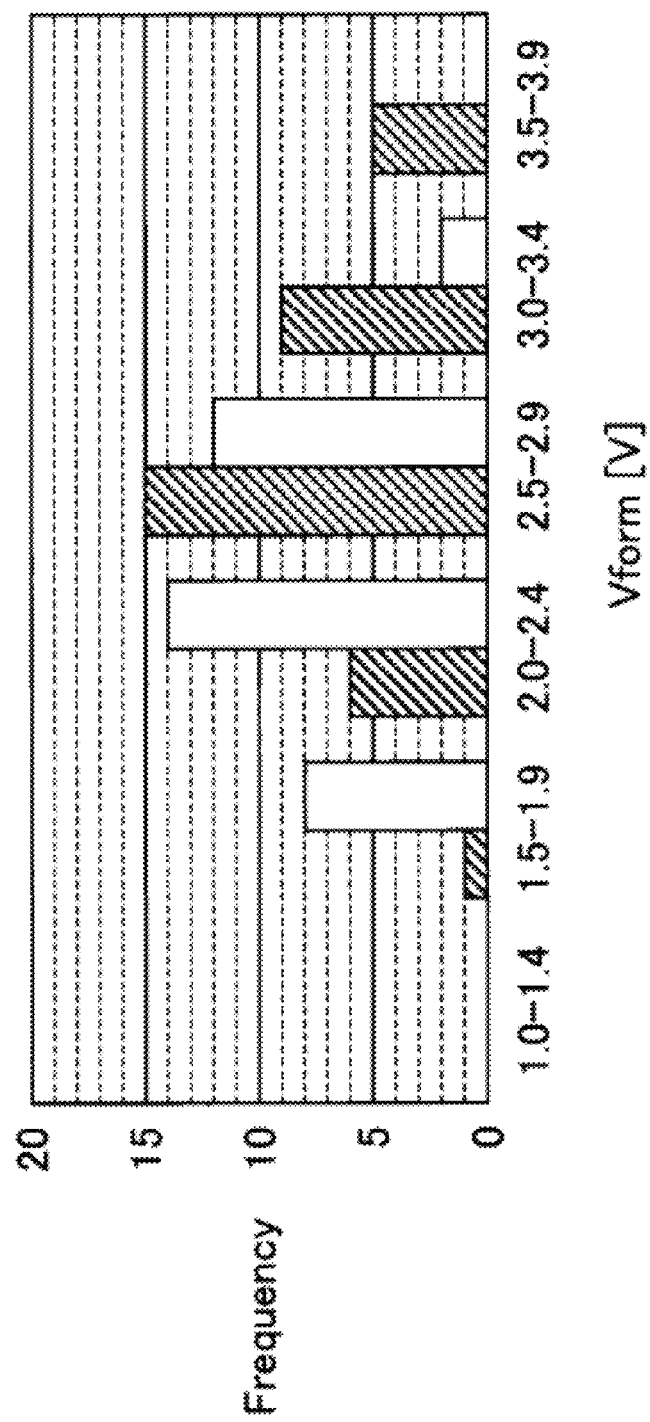
FIG. 4 is a graph illustrating distributions of a forming voltage for the resistance change element in FIG. 1.

FIG. 4 is a graph illustrating distributions of a voltage value for the forming process Vform (hereinafter, referred to as a forming voltage value Vform) with respect to the resistance change element RES in FIG. 1. The distribution of the unshaded bars represents characteristics of the resistance change element RES in FIG. 1, and the distribution of the shaded bars represents characteristics of a resistance change element (single resistance change element) having an insulating part between a pair of electrodes. The number of samples is 36 each. For example, in the single resistance change element, a nickel dioxide part ($NiO_2$ film) is sandwiched between a pair of electrodes including platinum.

As illustrated in FIG. 1, forming the two insulating parts INS1 and INS2 in the resistance change element RES enables the resistance part R1 or R2 to be formed only in the insulating part INS1 or INS2 that has a lower withstand pressure. Thereby, the distribution of the forming voltage value Vform may be shifted to the lower side and shifting of the forming voltage value Vform to the higher voltage side may be suppressed. In other words, the forming voltage value Vform may be made relatively low. Generally, when the forming process is performed, a voltage having the substantially same value as the forming voltage value Vform is applied to an element, such as a transistor, formed on a semiconductor substrate along with the resistance change element RES. Therefore, lowering of the forming voltage value Vform enables lowering of the voltage applied to the transistor or the like. As a result, failures like destruction of not only the resistance change element RES but also the gate of the transistor may be reduced. That is, the reliability of each of the elements may be improved. Generally, with a larger the number of the insulating parts formed between the bottom electrode EL1 and the top electrode EL2, the distribution of the forming voltage value Vform may be shifted to the lower side and shifting of the forming voltage value Vform to the higher voltage side may be suppressed.

FIG. 5 illustrates the semiconductor memory ReRAM (resistance change memory) including the resistance change element RES in FIG. 1. Each boldface signal line in FIG. 5 represents a plurality of lines. Parts of the blocks to which the boldface lines are coupled include a plurality of circuits. For example, the semiconductor memory ReRAM may be mounted in a battery-driven portable device, an IC card, an RFID tag, or the like as a non-volatile RAM.

The resistance change element RES is a memory part of a memory cell MC. FIG. 5 illustrates only the resistance parts R1 and R2 of the resistance change element RES. The resistance part R1 or R2 represented by a solid line undergoes the breakdown through the forming process and may enter the set state (low-resistance state) or the reset state (high-resistance state). The resistance part R1 or R2 represented by a dotted line undergoes no breakdown through the forming process and enters neither the set state (low-resistance state) nor the reset state (high-resistance state). That is, as described above with reference to FIG. 3, either the insulating part INS1 or the insulating part INS2 undergoes the breakdown in each of the memory cells MC through the forming process. The resistance part R1 or R2 represented by the dotted line is not substantially formed in the insulating part INS1 or INS2 in FIG. 1. The voltage value of the resistance part R1 or R2 formed through the breakdown changes depending on the application of the voltage.

For example, the semiconductor memory ReRAM is formed on a silicon substrate using a CMOS process. The semiconductor memory ReRAM includes an address buffer ADB, a word decoder WDEC, a column decoder CDEC, a command buffer CMDB, a timing control circuit TCNT, a memory cell array ARY, a bit line control part BLCNT, a sense amplifier part SA, and a data input/output buffer IOB. For example, these circuits receive a power supply voltage VCC supplied to an external terminal to operate.

The address buffer ADB receives an address signal AD through an address terminal and outputs the received signal to the word decoder WDEC and the column decoder CDEC. The word decoder WDEC decodes higher-order bits of the address signal AD (row address RAD) and changes the word line WL, based on the decoded row address RAD, from the low level to the high level for a given period. The high-level voltage of the word line WL may be a voltage higher than the power supply voltage VCC. Here, the high-level voltage may be generated by, for example, a voltage boosting circuit formed in the memory ReRAM. The column decoder CDEC decodes lower-order bits of the address signal AD (column address CAD) and changes a column selection signal CL corresponding to a bit line BL, based on the decoded column address CAD, from the low level to the high level for a given period.

For example, the command buffer CMDB receives a command signal, such as a chip selection signal and a write enable signal, through a command terminal. The command buffer CMDB decodes the received signal to output a read control signal RD or a write control signal WR to the timing control circuit TCNT in accordance with the decoded result. The timing control circuit TCNT receives the read control signal RD or the write control signal WR and outputs a timing signal for operating the word decoder WDEC, the column decoder CDEC, the data input/output buffer IOB, and the sense amplifier part SA, or the like. Then, the reading operation of the memory cell MC is performed in response to the read control signal RD. The writing operation of the memory cell MC is performed in response to the write control signal WR.

For example, the memory cell array ARY includes the memory cells MC arranged in a matrix. Each of the memory cells MC includes a transfer transistor T1 (nMOS transistor) and the resistance part R1 or R2 for storing a logic of data. The memory cells MC arranged in the horizontal direction of FIG. 5 are coupled to the common word line WL. The memory cells MC arranged in the vertical direction of FIG. 5 are coupled to the common bit line BL. For example, 2048 memory cells MC may be coupled to each of the word lines WL. For example, 512 memory cells MC may be coupled to each of the bit lines BL.

The bit line control part BLCNT supplies each of the bit lines BL with a given voltage at the times of the reading operation and the writing operation in the forming process. The sense amplifier part SA includes a sense amplifier coupled to the bit lines BL. For example, the sense amplifier determines the logical value of the data stored in the memory cell MC in accordance with the current that flows in from the bit lines BL. The data input/output buffer IOB selects, for example, 16 bits out of the read data having a plurality of bits determined by the sense amplifier part SA in accordance with a column decode signal to output the selected read data to the data input/output terminal I/O. The data input/output terminal I/O receives, for example, 16 bits.

When the semiconductor memory ReRAM is supplied with the read command RD, the bit line control part BLCNT sets each of the bit lines BL (e.g., one end of the resistance part R1 or R2) to have, for example, 0.2 V. The value 0.2 V represents the value of the read voltage VRD in FIG. 3. The read voltage VRD is generated by an internal voltage generating circuit formed in the semiconductor memory ReRAM using the power supply voltage VCC. After that, any one of the word lines WL is activated to the high level for a given period and the other end of the resistance part R1 or R2 is coupled to a ground line GND. That is, the read voltage VRD is applied between the bottom electrode EL1 and the top electrode EL2 in FIG. 1.

When one of the memory cells MC coupled to the selected word line WL is in the low-resistance state (set state), a relatively large amount of current flows from the bit line BL coupled to the memory cell MC to the ground line GND coupled to the memory cell MC. Thereby, the current that flows from the bit line BL to the sense amplifier decreases. The sense amplifier detects that the amount of the current from the bit line BL is small and determines the logical value (e.g., the logic "1") of the data stored in the memory cell MC. When the sense amplifier determines the logic "1," the data input/output buffer IOB outputs a high-level data signal to the data input/output terminal I/O.

On the other hand, when one of the memory cells MC coupled to the selected word line WL is in the high-resistance state (reset state), a relatively small amount of current flows from the bit line BL coupled to the memory cell MC to the ground line GND coupled to the memory cell MC. Thereby, the current that flows from the bit line BL to the sense amplifier increases. The sense amplifier detects that the amount of the current from the bit line BL is large and determines the logical value (e.g., the logic "0") of the data stored in the memory cell MC. When the sense amplifier determines the logic "0," the data input/output buffer IOB outputs a low-level data signal to the data input/output terminal I/O.

In the present embodiment, the logic in the set state is "1" and the logic in the reset state is "0." Alternatively, the logic in the set state may be "0" and the logic in the reset state may be "1." As described above with reference to FIG. 3, the application of the read voltage VRD causes neither the transition from the low-resistance state to the high-resistance state nor the transition from the high-resistance state to the low-resistance state. Accordingly, the reading operation may not cause destruction of the logic of the data held in the memory cell MC.

On the other hand, when the semiconductor memory ReRAM is supplied with the write command WR, the above-described reading operation is performed prior to the writing operation and the logic of the data held in each of the memory cells MC is determined. After that, the writing operation is performed only with respect to the memory cell MC (write memory cell) holding a logic different from the logic of the write data received at the data input/output terminal I/O.

The bit line control part BLCNT sets the bit line BL coupled to the write memory cell to have, for example, 1.5 V and sets the other bit lines BL to have 0 V. For example, 1.5 V is the value of the power supply voltage VCC supplied to the semiconductor memory ReRAM and the value of the write voltage VWR illustrated in FIG. 3. Then, the word line WL coupled to the memory cell MC for writing data is activated to the high level for a given period. Thereby, the write voltage VWR is applied only to the resistance part R1 or R2 of the write memory cell. The resistance part R1 or R2 to which the write voltage VWR is applied transitions from the low-resistance state to the high-resistance state or from the high-resistance state to the low-resistance state. That is, the logic of the data held in the write memory cell is rewritten to another logic.

When the forming process is performed with respect to all of the memory cells MC of the semiconductor memory ReRAM in the manufacturing process of the semiconductor memory ReRAM, the power supply terminal of the semiconductor memory ReRAM is supplied with, for example, 3.5 V by an LSI tester or the like. Next, the semiconductor memory ReRAM enters a forming mode. For example, the forming mode may be entered by applying a high voltage to a test terminal. Alternatively, the forming mode may be entered by supplying the command buffer CMDB with a forming command (test command).

In the forming mode, the bit line control part BLCNT sets all of the bit lines BL to have the value of the power supply voltage VCC (forming voltage value Vform). Next, for example, the semiconductor memory ReRAM is supplied with the read commands and all of the word lines WL are sequentially activated to the high level. In the forming mode, for example, operations of the column decoder CDEC, the sense amplifier, and the data input/output buffer IOB are prohibited. The forming voltage value Vform is applied to each of the memory cells MC. Either the insulating part INS1 or the insulating part INS2 in FIG. 1 that has a lower withstand pressure undergoes the breakdown to form the resistance part R1 or R2.

In the forming mode, the semiconductor memory ReRAM is supplied with a voltage of, for example, 3.5 V that is higher than a typical power supply voltage VCC being, for example, 1.5 V. Thereby, the gate of the transistor in the semiconductor memory ReRAM is supplied with a voltage of, for example, 3.5 V. When the high-level voltage of the word line WL is a voltage obtained by boosting the power supply voltage VCC, the boosted voltage of, for example, 4 V is applied to the gate of a transfer transistor T1 of the memory cell MC. Accordingly, the higher the forming voltage is, the more likely the gate of a transistor, such as the transfer transistor T1, may suffer damage. In the present embodiment, the forming voltage value Vform may be lowered by forming a plurality of insulating parts, such as the insulating parts INS1 and INS2, in the resistance change element RES. As a result, damage to an element, such as the insulating part INS1 or INS2, or the transistor, caused by the forming process may be prevented. That is, the reliability and yield of the semiconductor memory ReRAM may be improved.

Figure 6:
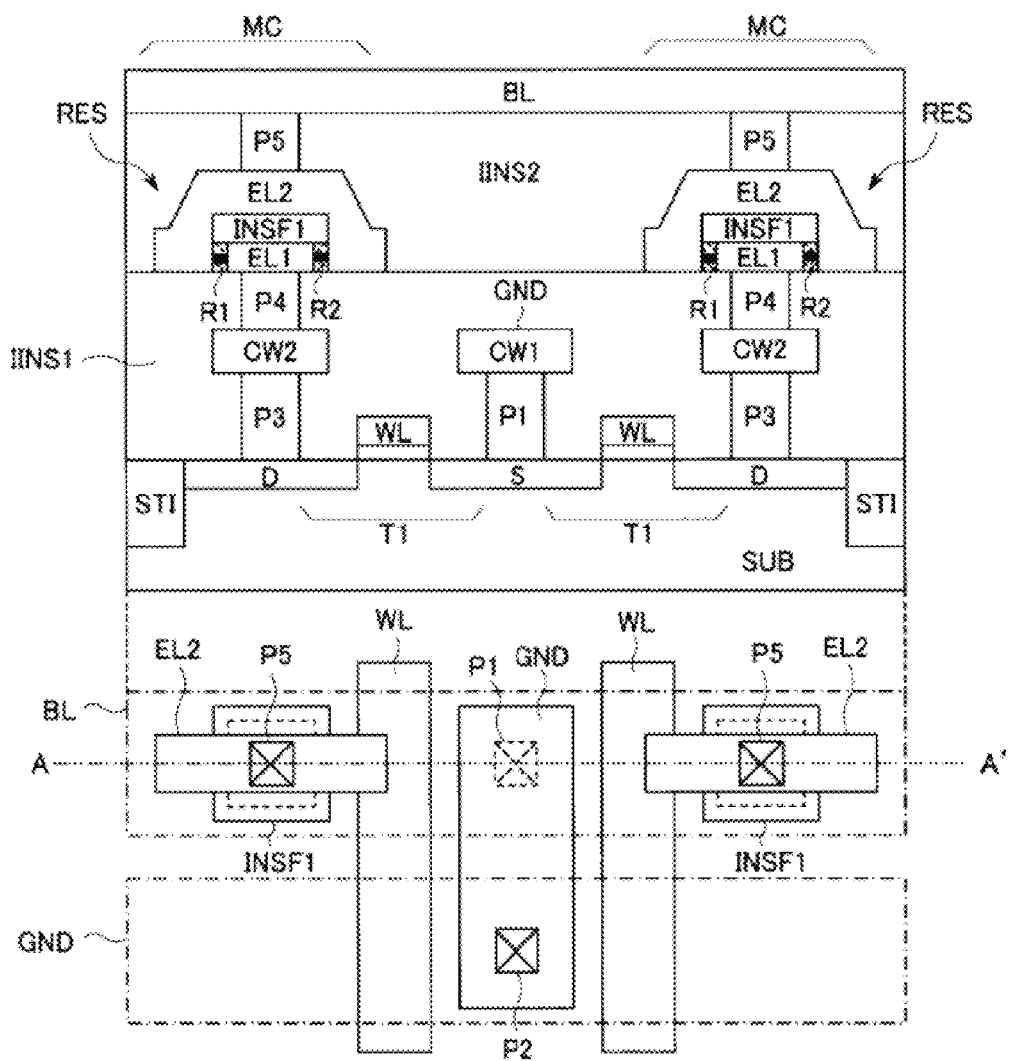
FIG. 6 illustrates cross sectional and plan views of the memory cells in FIG. 5.

FIG. 6 illustrates cross sectional and plan views of the memory cells MC in FIG. 5. FIG. 6 includes a pair of the memory cells MC arranged in the vertical direction in FIG. 5. The cross sectional view on the upper side of FIG. 6 illustrates a cross section along the A-A' line.

Each of the memory cells MC includes the transfer transistor T1 formed on a silicon substrate SUB, the interlayer insulating film IINS1 formed over the transfer transistor T1, and the resistance change element RES formed over the interlayer insulating film IINS1. The regions in which the memory cells MC are formed are electrically isolated from the other regions by Shallow Trench Isolation (STI). The source S of the transfer transistor T1 is coupled through a contact plug P1 to a coupling wire CW1. The coupling wire CW1 is coupled through a contact plug P2 to the ground line GND arranged along the bit line BL.

The drain D of the transfer transistor T1 is coupled through a contact plug P3, a coupling wire CW2, and a contact plug P4 to the bottom electrode EL1 of the resistance change element RES. The bit line BL is formed over the resistance change element RES and the interlayer insulating film IINS1. The top electrode EL2 of the resistance change element RES is coupled through a contact plug P5 to the bit line BL. As described above, FIG. 6 illustrates both the resistance part R1 and the resistance part R2 although the resistance change element RES has either the resistance part R1 or the resistance part R2.

Figure 7A:
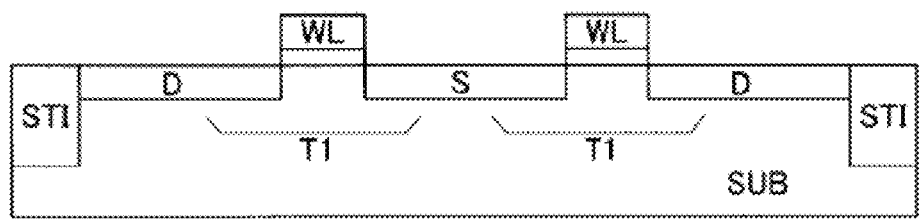
FIGS. 7A to 7H illustrate a method for manufacturing the memory cells in FIG. 6.

FIGS. 7A to 7H illustrate a method for manufacturing the memory cells MC in FIG. 6. Referring to FIG. 7A, element isolation regions STI are formed on the silicon substrate SUB. Further, the transfer transistors T1 are formed on the silicon substrate SUB by a typical method for manufacturing a MOS transistor.

Figure 7B:
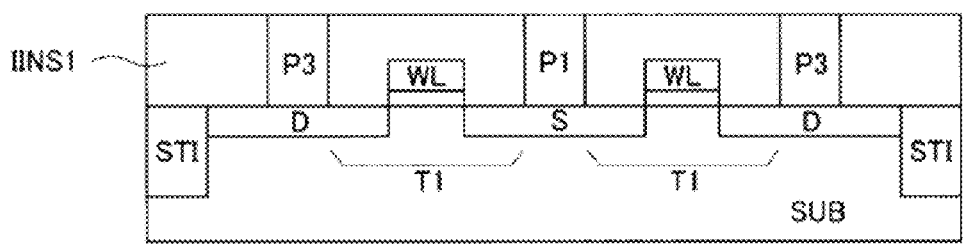

Referring to FIG. 7B, a silicon dioxide film is deposited over the transfer transistors T1 to form the interlayer insulating film IINS1 by, for example, CVD. Subsequently, contact holes are formed through the interlayer insulating film IINS1 by photolithography and dry etching to reach source regions and drain regions of the transfer transistors T1. A conductive film is formed over the interlayer insulating film IINS1 and in the contact holes by sputtering or CVD. The conductive film is formed by, for example, deposition of a titanium nitride (TiN) film and a tungsten (W) film. After that, the conductive film on the interlayer insulating film IINS1 is removed by Chemical Mechanical Polishing (CMP). Thus, the resultant conductive film buried in the contact holes forms the contact plugs P1 and P3.

Figure 7C:
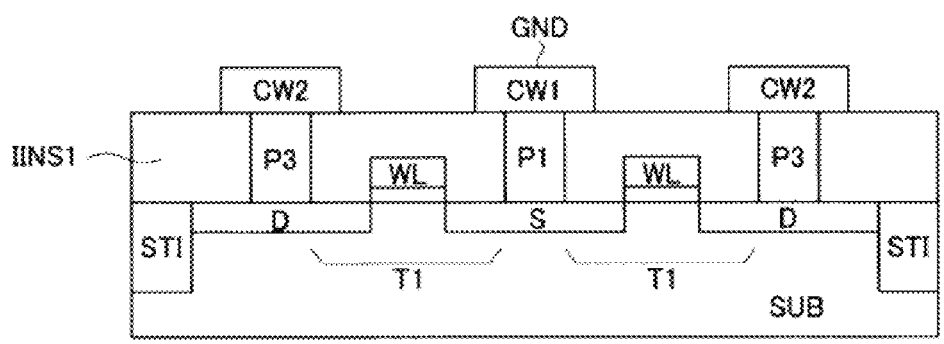

Referring next to FIG. 7C, a conductive film is deposited over the interlayer insulating film IINS1 including the contact plugs P1 and P3 by, for example, sputtering. The conductive film may be aluminum (Al) or copper (Cu), for example. After that, the coupling wires CW1 (GND) coupled to the contact plugs P1 and the coupling wires CW2 coupled to the contact plugs P3 are formed by photolithography and dry etching.

Figure 7D:
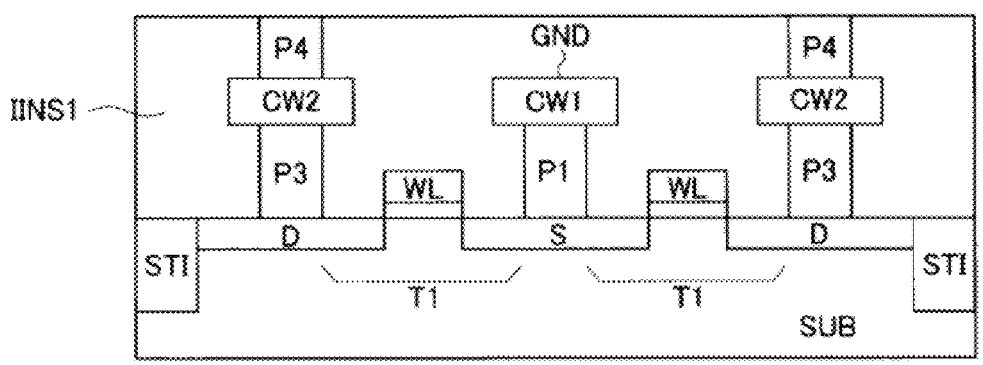

Referring to FIG. 7D, a silicon dioxide film is deposited to cover the coupling wires CW1 and CW2 as well as the exposed surfaces of the interlayer insulating film IINS1 by, for example, CVD. Subsequently, contact holes are formed in the resultant interlayer insulating film IINS1 by photolithography and dry etching to expose the coupling wires CW2. A conductive film is formed over the interlayer insulating film IINS1 and in the contact holes by sputtering or CVD. The conductive film is formed by, for example, deposition of a titanium nitride (TiN) film and a tungsten (W) film. After that, the conductive film over the interlayer insulating film IINS1 is removed by CMP. Thus, the resultant conductive film buried in the contact holes forms the contact plugs P4.

Figure 7E:
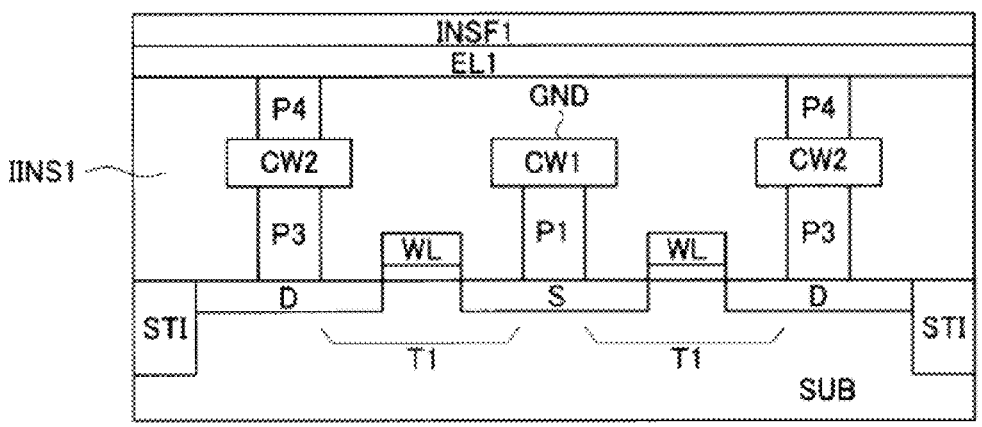

A process for manufacturing the resistance change element RES will be now described. Referring to FIG. 7E, a conductive film is deposited over the interlayer insulating film IINS1 including the contact plugs P4 by, for example, sputtering. The conductive film may be nickel (Ni), for example. The conductive film may be formed by deposition of a titanium nitride (TiN) instead of nickel (Ni). The silicon dioxide film INSF1 is deposited on the nickel film by, for example, CVD.

Figure 7F:
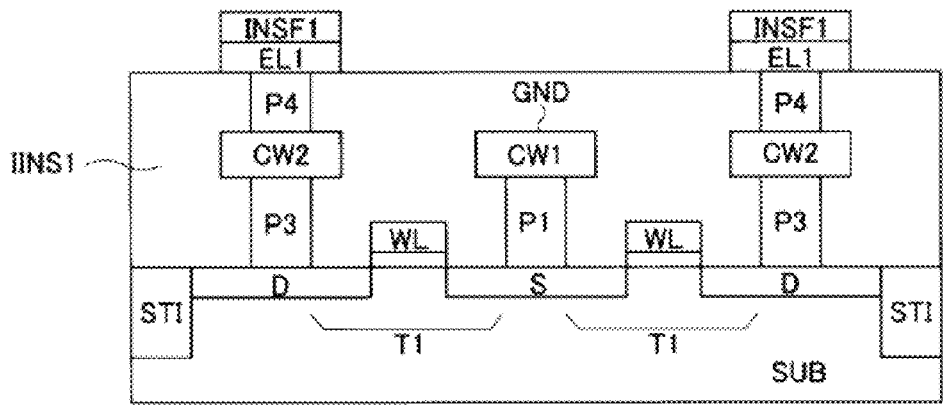
Figure 7G:
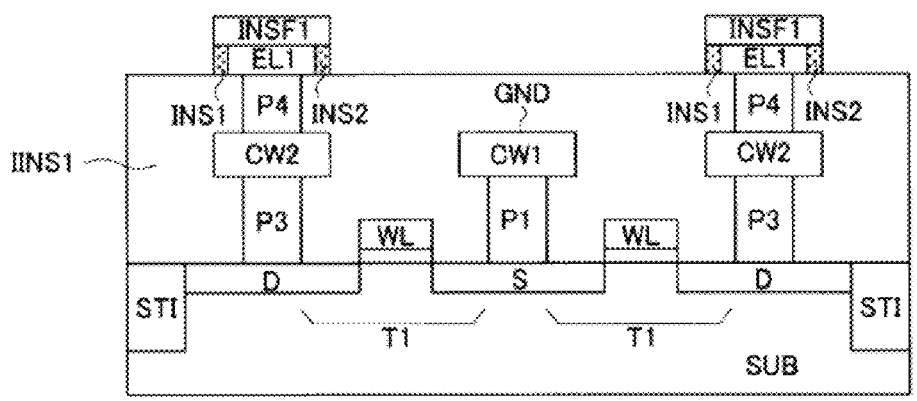

Referring next to FIG. 7F, the silicon dioxide film INSF1 and the conductive film are concurrently and selectively removed to form the bottom electrode patterns EL1 and the insulating film patterns INSF1 by photolithography and dry etching. After that, heat treatment is performed in an oxygen atmosphere. In FIG. 7F, only the side walls of the bottom electrode pattern EL1 are exposed. As a result, only the periphery of the bottom electrode pattern EL1 is oxidized by the heat treatment to form the insulating parts INS1 and INS2 as illustrated in FIG. 7G.

For example, when the bottom electrode EL1 is nickel, oxidation by an electric furnace may be performed at a temperature of 350° C. in an oxygen atmosphere for 20 minutes, and oxidation by Rapid Thermal Annealing (RTA) may be performed at a temperature of 400° C. in an oxygen atmosphere for one minute. For example, when the bottom electrode EL1 is a titanium nitride, oxidation by an electric furnace may be performed at a temperature of 550° C. in an oxygen atmosphere for 20 minutes, and oxidation by RTA may be performed at a temperature of 500° C. in an oxygen atmosphere for one minute. Generally, the oxidation by RTA enables easier control of the thickness of the insulating parts INS1 and INS2. When the bottom electrode EL1 includes another material, it is preferable to appropriately select the oxidation conditions, such as the temperature and duration, depending on the material or combination of materials.

Figure 7H:
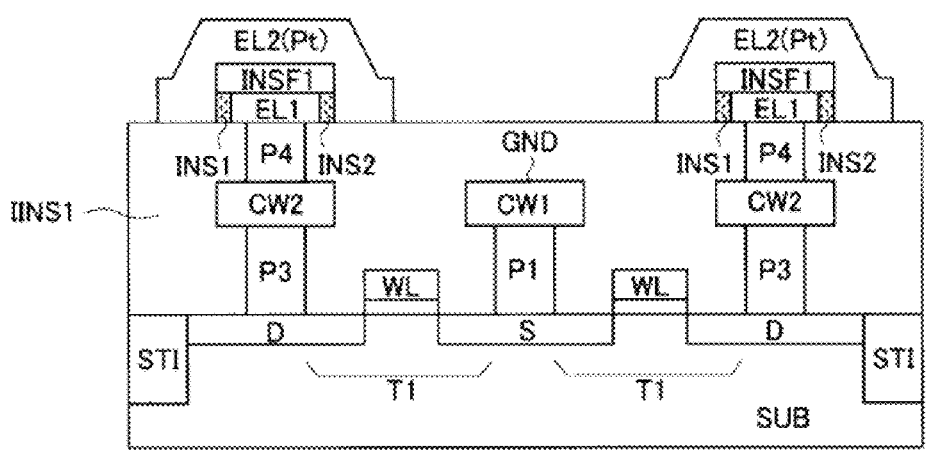

Referring to FIG. 7H, a conductive film is deposited over the interlayer insulating film IINS1 and the silicon dioxide film INSF1 by, for example, sputtering. For example, the conductive film may be platinum (Pt). The conductive film is selectively removed by photolithography and dry etching and the resultant conductive film forms the top electrodes EL2.

Next, as illustrated in FIG. 6, the silicon dioxide film (interlayer insulating film IINS2) is deposited over the interlayer insulating film IINS1 and the top electrodes EL2 by, for example, CVD. Next, contact holes are formed in the interlayer insulating film IINS2 to expose the top electrode EL2 by photolithography and dry etching. Next, a conductive film is formed over the interlayer insulating film IINS2 and in the contact holes by sputtering or CVD. For example, the conductive film is formed by deposition of a titanium nitride (TiN) film and a tungsten (W) film. After that, the conductive film over the interlayer insulating film IINS2 is removed by CMP. Thus, the resultant conductive film buried in the contact holes forms the contact plugs P5. Concurrently, the contact plugs P2 (GND) in FIG. 6 are also formed.

A conductive film is deposited over the interlayer insulating film IINS2 including the contact plugs P5 by, for example, sputtering. The conductive film may be aluminum (Al) or copper (Cu), for example. The bit line BL coupled to the contact plugs P5 and the ground line GND coupled to the contact plug P2 are formed by photolithography and dry etching.

After that, as described above with reference to FIGS. 2 and 5, the forming process is performed with respect to the resistance change element RES to form the resistance part R1 or R2 in either the insulating part INS1 or the insulating part INS2 that has a lower withstand pressure.

In the present embodiment, the insulating parts INS1 and INS2 are arranged in parallel between the bottom electrode EL1 and the top electrode EL2 to form the resistance part R1 or R2 in either the insulating part INS1 or the insulating part INS2 that has a lower breakdown voltage. In this way, the resistance part R1 or R2 may be formed with a lower forming voltage. The reliability of the resistance change element RES, the transistor T1, and the like may be improved due to the reduced forming voltage.

The insulating parts INS1 and INS2 are formed by oxidation of the periphery of the first electrode patterns EL1. The insulating parts INS1 and INS2 may be formed without using photolithography. Therefore, the resistance change element RES that utilizes a low forming voltage may be manufactured by a simple manufacturing method and the reliability thereof may be improved. The insulating parts INS1 and INS2 may be formed smaller than the minimum processing dimension allowed by photolithography. Therefore, even when the insulating parts INS1 and INS2 are formed in the resistance change element RES, the resistance change element RES may be formed small. This enables reduction of the forming voltage for a semiconductor memory ReRAM that has a large storage capacity and improves the reliability thereof.

Forming the resistance part R1 or R2 in parallel to the semiconductor substrate SUB or the insulating film IINS1 enables reduction of the height of the resistance change element RES. As a result, this enables reduction of the height of the interlayer insulating film IINS2 and the length of the contact plug formed in the interlayer insulating film IINS2. Thus, the reliability in coupling the contact plugs may be improved.

Figure 8:
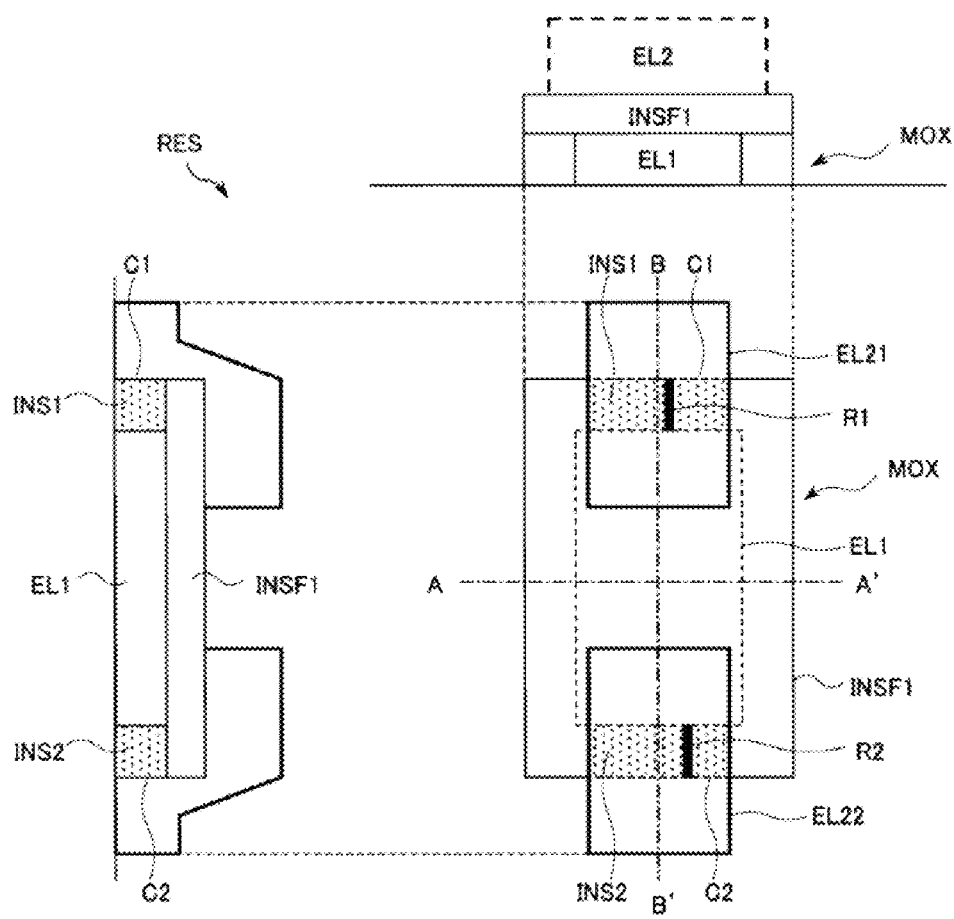
FIG. 8 illustrates a resistance change element according to another embodiment.

FIG. 8 illustrates a resistance change element RES according to another embodiment. The same elements as the elements described in the preceding embodiment are given the same reference numerals and detailed explanation thereof is omitted. The cross sectional view on the upper side of FIG. 8 illustrates a cross section along the A-A' line. The cross sectional view on the left side of FIG. 8 illustrates a cross section along the B-B' line. Materials d here for an electrode EL1 and a metal oxide MOX may be the same as the materials used in FIG. 1. Materials used here for electrodes EL21 and EL22 may be the same as the material used for the electrode EL2 in FIG. 1.

The resistance change element RES includes a pair of the top electrode EL21 and EL22 formed by covering part of an insulating film INSF1. The top electrode EL21 is coupled through a contact part C1 and an insulating part INS1 to the bottom electrode EL1. The top electrode EL22 is coupled through a contact part C2 and an insulating part INS2 to the bottom electrode EL1. Subsequently, a resistance part R1 is formed in the insulating part INS1 and a resistance part R2 is formed in the insulating part INS2. In the present embodiment, as will be described later, whether either the resistance part R1 or the resistance part R2 is formed or both of the resistance parts R1 and R2 are formed depends on how to perform the forming process.

Figure 9:
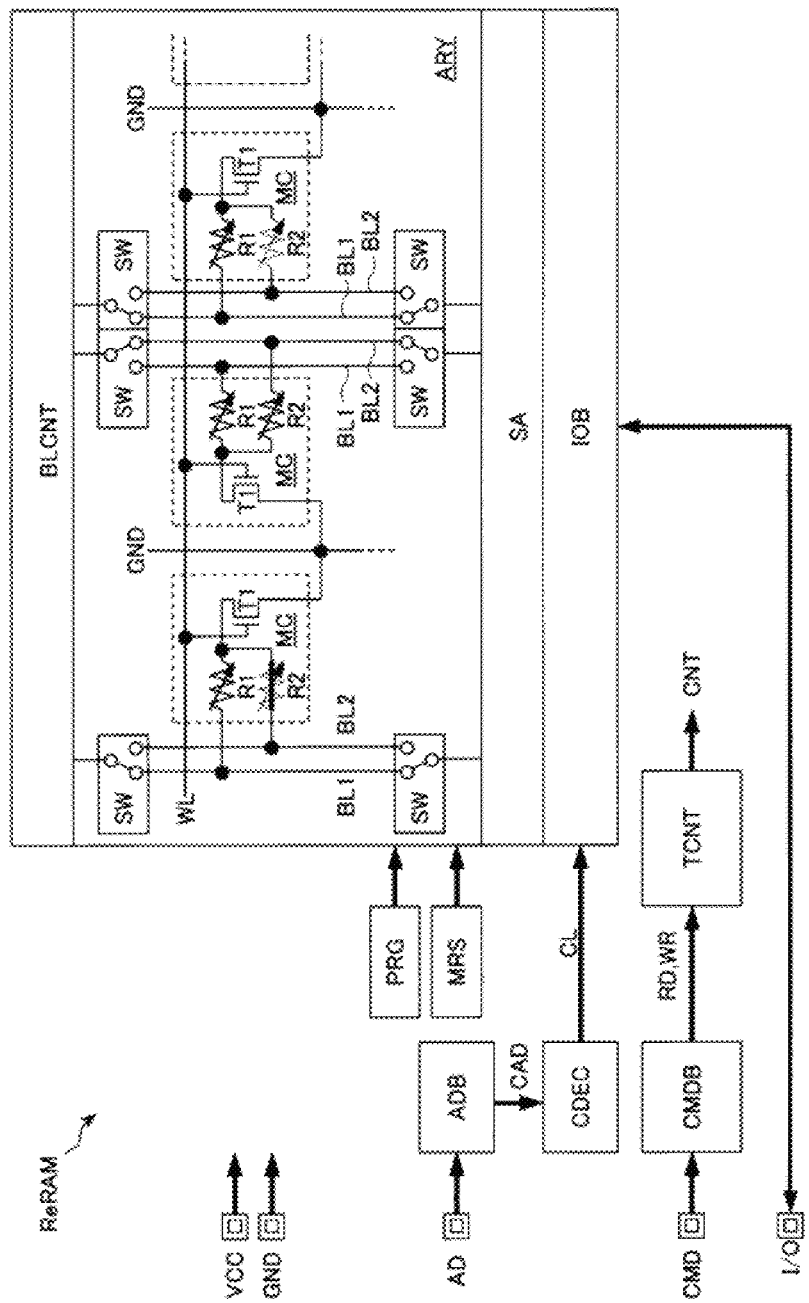
FIG. 9 illustrates a semiconductor memory including the resistance change element in FIG. 8.

FIG. 9 illustrates a semiconductor memory ReRAM where the resistance change element RES in FIG. 8 is mounted. The semiconductor memory ReRAM has a memory cell array ARY different from the memory cell array ARY of the semiconductor memory ReRAM in FIG. 5. In addition, the semiconductor memory ReRAM includes a program circuit PRG and a mode register MRS. The memory cell array ARY includes only one word line WL. Therefore, the semiconductor memory ReRAM may not include any word decoder WDEC. The word line WL is synchronized to a read control signal RD or a write control signal WR to be activated.

The memory cell array ARY includes memory cells MC coupled to the word line WL, bit lines BL1 and BL2 each of which is coupled to each of the memory cells MC, switches SW each of which is arranged between each of the bit lines BL1 and BL2, and a sense amplifier part SA, and switches SW each of which is arranged between each of the bit lines BL1 and BL2 and a bit line control part BLCNT. For example, 2048 memory cells MC may be coupled to the word line WL and the semiconductor memory ReRAM may have a storage capacity of 2048 bits. For example, the semiconductor memory ReRAM may be mounted in an IC card, an RFID tag, or the like as a non-volatile RAM.

The bit line BL1 is coupled to the resistance part R1 and the bit line BL2 is coupled to the resistance part R2. Each of the switches SW couples the bit line BL1 or BL2 to a sense amplifier to which the sense amplifier part SA corresponds and the bit line control part BLCNT in accordance with a program state of the program circuit PRG. For example, the program circuit PRG includes a fuse programmed for setting a switching state of the switch SW. The program circuit PRG may include a rewritable, non-volatile memory circuit, such as a memory cell MC, programmed for setting the switching state of the switch SW.

The mode register MRS is set in accordance with a logic of a data signal I/O supplied along with a mode register setting command received by a command buffer CMDB. The switching state of each of the switches SW is set with respect to the mode register MRS. The switching state set with respect to the mode register MRS has a higher priority than the switching state programmed with respect to the program circuit PRG. For example, when the switching state for coupling the bit line BL2 to the sense amplifier part SA and the bit line control part BLCNT is set with respect to the mode register MRS after the switching state for coupling the bit line BL1 to the sense amplifier part SA and the bit line control part BLCNT is programmed with respect to the program circuit PRG, the switch SW couples the bit line BL2 to the sense amplifier part SA and the bit line control part BLCNT. The mode register MRS is made active mainly in a test mode. Once the memory ReRAM is shipped, a user may not access the mode register MRS and the mode register MRS may not control the switching state of each of the switches SW.

The mode register MRS enables the switching state of the switch SW to be set as desired. Therefore, the forming process may be performed by sequentially coupling the bit lines BL1 and BL2 to the bit line control part BLCNT. When the program circuit PRG includes a rewritable, non-volatile memory circuit, the memory circuit enables the switching state of the switch SW to be changed repeatedly. The mode register MRS may be omitted in this case.

In this example, the resistance part R2 of the memory cell MC illustrated on the left side of FIG. 9 has a short circuit failure while a transfer transistor T1 and the bit line BL2 short out. For example, such a short circuit failure is caused by the breakdown through the forming process. The switches SW corresponding to the memory cell MC on the left side of FIG. 9 couple the bit line BL1 to the bit line control part BLCNT and the sense amplifier part SA. That is, the bit line BL2 to which one end of the resistance part R2 is coupled enters a floating state. In this way, the memory cell MC may be operated as desired even when the memory cell MC has a short circuit failure. That is, a failure of the memory cell MC may be remedied.

Two resistance parts R1 and R2 are formed in the middle memory cell MC in FIG. 9 by the forming process. Here, the switches SW corresponding to the memory cell MC couple either the bit line BL1 or the bit line BL2 (in this case, BL2) to the bit line control part BLCNT and the sense amplifier part SA. In the memory cell MC illustrated on the right side of FIG. 9, only the resistance part R1 is formed by the forming process. Therefore, the switches SW corresponding to the memory cell MC illustrated on the right side of FIG. 9 couple the bit line BL1 to the bit line control part BLCNT and the sense amplifier part SA. The forming process for the memory ReRAM in FIG. 9 will be described later with reference to FIG. 10.

Figure 10:
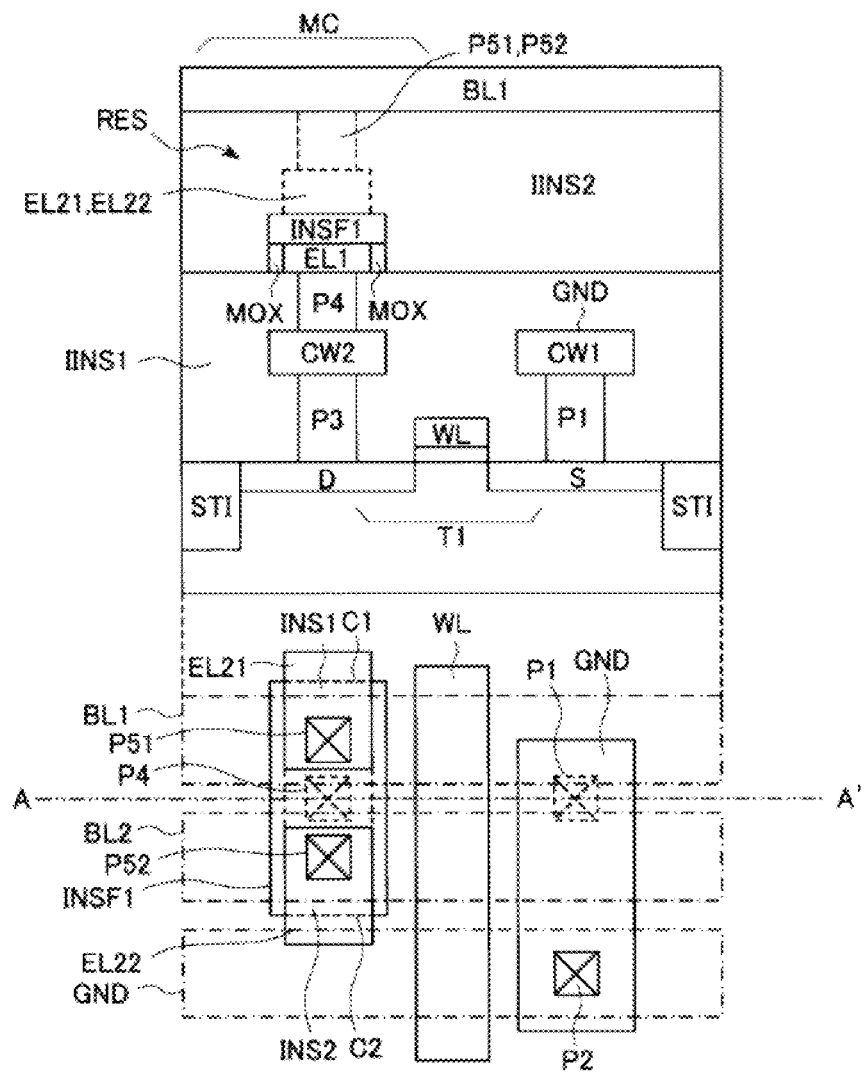
FIG. 10 illustrates cross sectional and plan views of the memory cell in FIG. 9.

FIG. 10 illustrates cross sectional and plan views of the memory cell MC in FIG. 9. Detailed explanation of the same elements as the elements in FIG. 6 is omitted. The cross sectional view on the upper side of FIG. 10 illustrates a cross section along the A-A' line. The memory cell MC in FIG. 10 is different from the memory cell MC in FIG. 6 in terms of the resistance change element RES and the bit lines BL1 and BL2.

The top electrodes EL21 and EL22 of the resistance change element RES are coupled through contact plugs P51 and P52 to the bit lines BL1 and BL2, respectively. The resistance part R1 in FIG. 8 is formed in the insulating part INS1 and the resistance part R2 in FIG. 8 is formed in the insulating part INS2.

The memory cell MC in FIG. 10 is manufactured as follows. The same processes as those described above with reference to FIGS. 7A to 7G for manufacturing the memory cells MC in FIG. 5 are performed. That is, the side wall portions of the bottom electrode pattern EL1 are oxidized to form the insulating parts INS1 and INS2. Next, similar to the memory cells MC in FIG. 5, a conductive film including, for example, platinum (Pt) is deposited over the interlayer insulating film IINS1 and the silicon dioxide film INSF1. Then, the conductive film is selectively removed to form the top electrodes EL21 and EL22 by photolithography and dry etching.

A pair of contact holes is formed in the interlayer insulating film IINS2 to expose the top electrodes EL21 and EL22 to form the contact plugs P51 and P52. Subsequently, a conductive film including, for example, aluminum (Al) or copper (Cu) is formed over the contact plugs P51 and P52 and the interlayer insulating film IINS2 by sputtering, and then the conductive film is selectively removed to form the bit lines BL1 and BL2.

After that, the forming process for the resistance change element RES is performed. The forming process for the insulating part INS1 is performed by selecting the bit line BL1 with the switch SW. The forming process for the insulating part INS2 is performed by selecting the bit line BL2 with the switch SW. Thereby, as illustrated in FIG. 8, the resistance part R1 or R2 may be formed in either the insulating part INS1 or the insulating part INS2. That is, as described above with reference to FIG. 2 and FIG. 5, the resistance part R1 or R2 is formed in either the insulating part INS1 or the insulating part INS2 that has a lower withstand pressure. Alternatively, the resistance parts R1 and R2 may be formed in both of the insulating parts INS1 and INS2. Furthermore, the resistance part R1 or R2 having a short circuit failure may be removed from the sense amplifier part SA to remedy the short circuit failure.

Thus, effects similar to those obtained in the preceding embodiment may be obtained also in the present embodiment. Furthermore, in the present embodiment, the bit lines BL1 and BL2 are provided to each of the memory cells MC and thereby, either the resistance part R1 or the resistance part R2 may be used selectively. Therefore, even when a failure occurs in either the resistance part R1 or the resistance part R2, the failure may be remedied and, as a result, the reliability of the semiconductor memory ReRAM may be improved. In other words, the reliability of the memory ReRAM that utilizes a low forming voltage may be improved.

Figure 11:
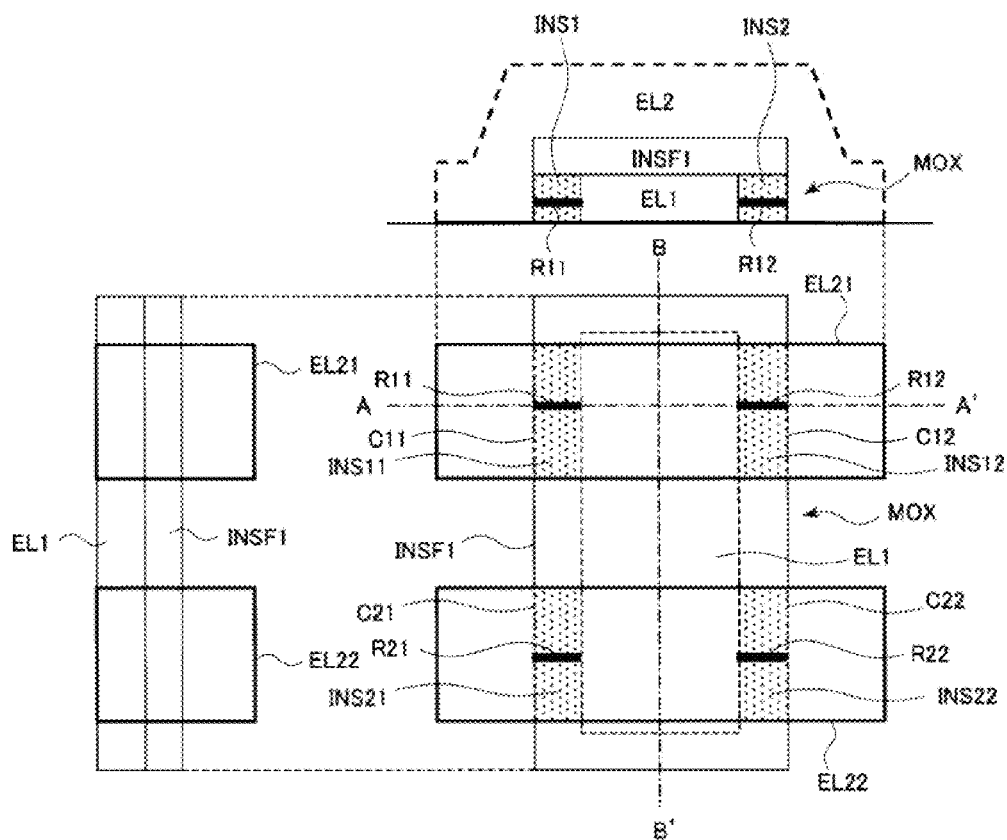
FIG. 11 illustrates a resistance change element according to another embodiment.

FIG. 11 illustrates a resistance change element RES according to another embodiment. The same elements as the elements described in the preceding embodiments are given the same reference numerals and detailed explanation thereof is omitted. Materials used here for a bottom electrode EL1 and a metal oxide MOX are the same as the materials used in FIG. 1. Materials used here for top electrodes EL21 and EL22 are the same as the material used for the top electrode EL2 in FIG. 1.

In the present embodiment, the top electrodes EL21 and EL22 are formed in parallel as illustrated in FIG. 11. It is therefore possible to form a pair of contact parts C11 and C12 coupled to the top electrode EL21 and a pair of insulating parts INS11 and INS12. It is also possible to form a pair of contact parts C21 and C22 coupled to the top electrode EL22 and a pair of insulating parts INS21 and INS22. Since four insulating parts INS11, INS12, INS21, and INS22 with different withstand pressures may be formed in one resistance change element RES, any one of the resistance parts R11, R12, R21, and R22 may be formed by the forming process. Thereby, a voltage with which any one of the insulating parts INS11, INS12, INS21, and INS22 undergoes the breakdown may be lowered and the forming voltage may be lowered as well. FIG. 11 illustrates all of the resistance parts R11, R12, R21, and R22.

Figure 12:
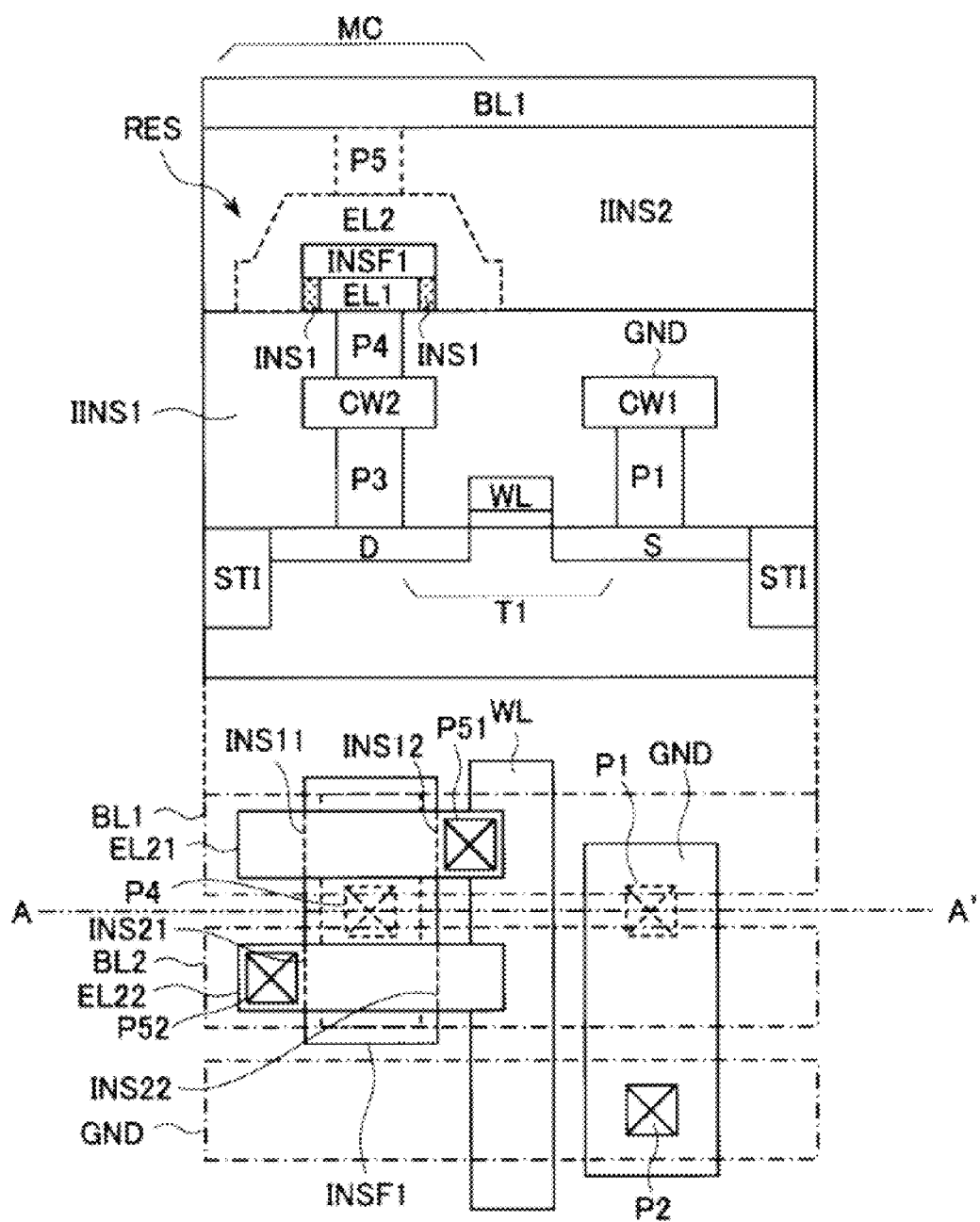
FIG. 12 illustrates cross sectional and plan views of a memory cell including the resistance change element in FIG. 11.

FIG. 12 illustrates cross sectional and plan views of a memory cell MC having the resistance change element RES in FIG. 11. The same elements as the elements in FIG. 6 and FIG. 10 are given the same reference numerals and detailed explanation thereof is omitted. The cross sectional view on the upper side of FIG. 12 illustrates a cross section along the A-A' line. In the memory cell MC, the shapes of the top electrodes EL21 and EL22 and the locations of the contact plugs P51 and P52 formed over the top electrodes EL21 and EL22 are different from those in FIG. 10. The other structural respects are the same as those in FIG. 10. The top electrodes EL21 and EL22 are arranged along the bit lines BL1 and BL2. For example, the memory cell MC is arranged in the memory cell array ARY in FIG. 9. In the present embodiment, the forming voltage value for the resistance change element RES may be further lowered. Therefore, the distribution of the forming voltage value Vform in FIG. 4 may be shifted to even lower and the reliability of the memory ReRAM may be further improved. Thus, effects similar to those obtained in the preceding embodiments may be obtained also in the present embodiment.

Figure 13:
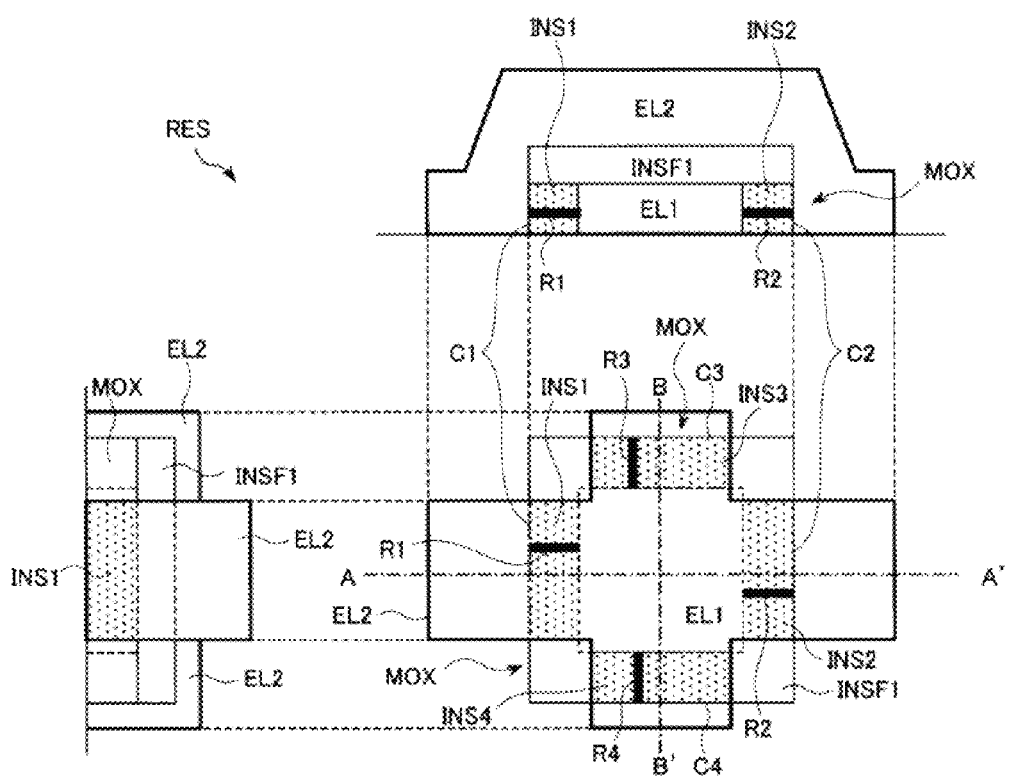
FIG. 13 illustrates a resistance change element according to another embodiment.

FIG. 13 illustrates a resistance change element RES according to another embodiment. The same elements as the elements described in the preceding embodiments are given the same reference numerals and detailed explanation thereof is omitted. Materials used here for top electrodes EL1 and EL2 and a metal oxide MOX are the same as the materials used in FIG. 1.

For example, the resistance change element RES is used for the memory cell MC in the memory cell array ARY of the memory ReRAM in FIG. 5. In the present embodiment, the top electrode EL2 is formed in a region excluding corner regions of an insulating film INSF1 to have a cross shape. Thereby, four contact parts C1 to C4 and four insulating parts INS1 to INS4 coupled to the top electrode EL2 are formed. Then, any one of resistance parts R1 to R4 may be formed by the forming process. FIG. 13 illustrates all of the resistance parts R1 to R4. The contact plug P5 in FIG. 6 is coupled to the central region of the top electrode EL2.

Thus, effects similar to those obtained in the preceding embodiments may be obtained also in the present embodiment. Furthermore, since any one of the resistance parts R1 to R4 may be formed in the insulating parts INS1 to INS4, the distribution of the forming voltage value Vform in FIG. 4 may be shifted even lower. That is, the reliability of the memory ReRAM may be improved by lowering the forming voltage value Vform.

Figure 14:
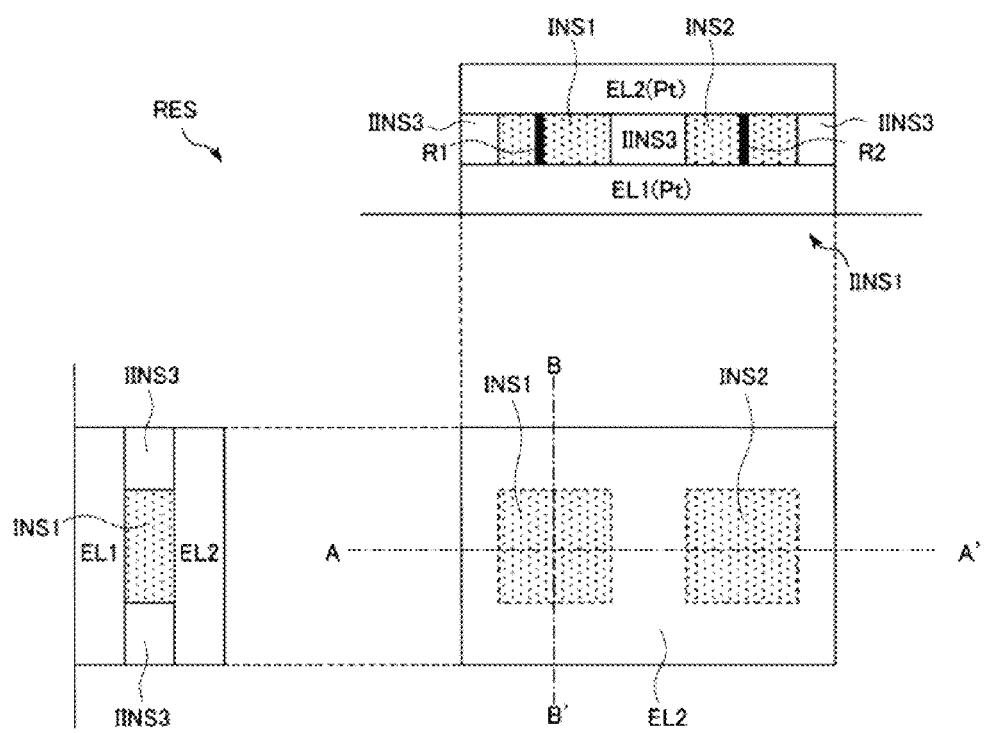
FIG. 14 illustrates a resistance change element according to another embodiment.

FIG. 14 illustrates a resistance change element RES according to another embodiment. The same elements as the elements described in the preceding embodiments are given the same reference numerals and detailed explanation thereof is omitted. The cross sectional view on the upper side of FIG. 14 illustrates a cross section along the A-A' line. The sectional view on the left side of FIG. 14 illustrates a cross section along the B-B' line.

In the present embodiment, insulating parts INS1 and INS2 are arranged in parallel between a bottom electrode EL1 and a top electrode EL2. The insulating parts INS1 and INS2 are formed in an insulating film INSF1. For example, the insulating parts INS1 and INS2 are formed in the insulating film INSF1. For example, the insulating parts INS1 and INS2 may each be a nickel dioxide ($NiO_2$). Either the insulating part INS1 or the insulating part INS2 undergoes the breakdown through the forming process where a given voltage is applied between the bottom electrode EL1 and the top electrode EL2 to form a resistance part R1 or R2. FIG. 14 illustrates both of the resistance parts R1 and R2.

The resistance change element RES in FIG. 14 is manufactured as follows. First, similar to the above-described processes, patterning is performed with respect to the bottom electrode EL1 formed over an interlayer insulating film IINS1 by photolithography and dry etching. For example, the bottom electrode EL1 may include platinum (Pt). A silicon dioxide film (interlayer insulating film IINS3) is deposited over the interlayer insulating film IINS1 and the bottom electrode EL1 by, for example, CVD.

Two contact holes are formed in given positions in the interlayer insulating film IINS3 by photolithography and dry etching to expose the bottom electrode EL1. Here, three or more contact holes may be formed in order to form three or more insulating parts. For example, a nickel film is formed over the interlayer insulating film IINS3 and in the contact holes by sputtering. After that, the nickel film over the interlayer insulating film IINS3 is removed by CMP. Then, heat treatment is performed in an oxygen atmosphere to change the nickel film buried in the contact holes into a nickel dioxide ($NiO_2$). That is, the insulating parts INS1 and INS2 are formed.

A conductive film is deposited over the interlayer insulating film IINS3 as well as over the insulating parts INS1 and INS2 by, for example, sputtering. For example, the conductive film may include platinum (Pt). The conductive film is selectively removed to form the top electrode EL2 by photolithography and dry etching. After that, as described above, the forming process for the resistance change element RES is performed to form a resistance part R1 or R2 in either the insulating part INS1 or the insulating part INS2 that has a lower withstand pressure.

Figure 15:
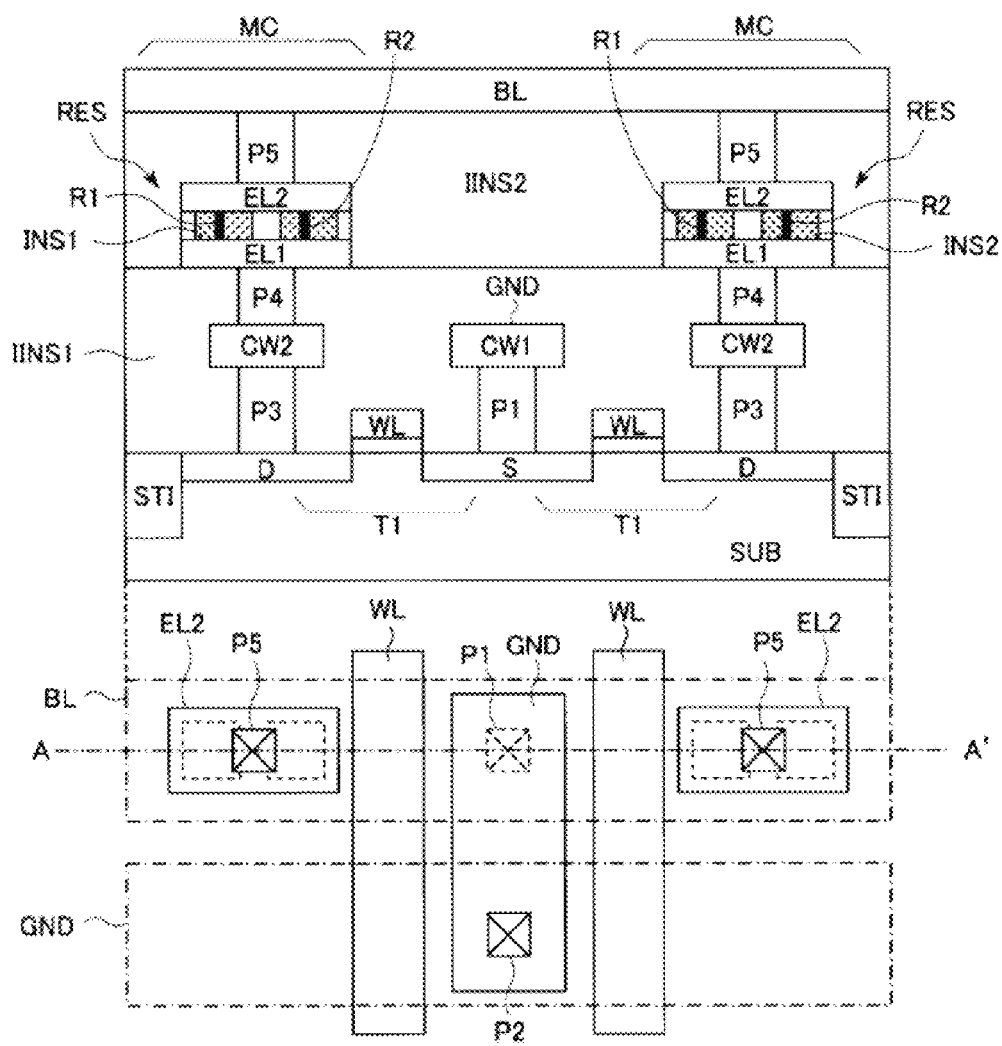
FIG. 15 illustrates cross sectional and plan views of memory cells each of which includes the resistance change element in FIG. 14.

FIG. 15 illustrates cross sectional and plan views of memory cells MC each of which has the resistance change element RES in FIG. 14. Detailed explanation of the same elements as the elements in FIG. 6 is omitted. The cross sectional view on the upper side of FIG. 15 illustrates a cross section along the A-A' line. In the present embodiment, the resistance parts R1 and R2 are formed in a depth direction of a semiconductor substrate SUB. Therefore, the electrodes EL1 and EL2 have shapes different from those in FIG. 6. The other structural respects are the same as those in FIG. 6. That is, the electrode EL1 is coupled through a contact plug P4, a coupling wire CW2, and a contact plug P3 to the drain D of a transfer transistor T1. The electrode EL2 is coupled through a contact plug P5 to a bit line BL. Thus, effects similar to those obtained in the preceding embodiments may be obtained also in the present embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A resistance change element comprising:

a semiconductor substrate;

a first insulation film formed over the semiconductor substrate;

a first electrode formed above the first insulation film and including a top surface, side surfaces and a bottom surface, the side surfaces including a first side surface provided at one end of the top surface and the bottom surface and a second side surface provided at the other end of the first top surface and the bottom surface;

a second insulation film formed so as to being located above a part of the top surface of the first electrode and being in contact with the part of the top surface of the first electrode;

a second electrode covering a part of the first insulation film, a part of the first side surface and the second side surface of the first electrode and a part of the second insulation film so that an upper surface, a third side surface and a fourth side surface of the second insulation film are directly in contact with the second electrode, the third side surface provided at one end of a lower surface of the second insulation film and the fourth side surface provided at the other end of the lower surface;

a first oxide film, including a first oxide of the first electrode, formed between the first side surface of the first electrode and a fifth side surface of the second electrode provided on the side of the third side surface; and wherein the first oxide film includes a first resistance part whose resistance value changes in accordance with a voltage applied to the first and second electrodes, wherein the first oxide film is directly in contact with the part of the first side surface of the first electrode, the fifth side surface of the second electrode and the lower surface of the second insulation film.

2. The resistance change element according to claim 1, wherein the first resistance part is arranged in a direction in which the second electrode extends.

3. The resistance change element according to claim 1, further comprising:

a third electrode above the first insulation film;

a third insulation film formed above a part of a top surface of the third electrode;

a fourth electrode covering a part of the first insulation film, a part of the side surface of the third electrode and a part of the third insulation film;

a third oxide film, including an oxide of the third electrode, formed between a part of the side surface of the third electrode and the fourth electrode;

wherein the third oxide film includes a second resistance part whose resistance value changes in accordance with a voltage applied to the fourth and third electrodes.

4. The resistance change element according to claim 1, wherein the first electrode includes either a transition metal or zinc.

5. The resistance change element according to claim 1, wherein the first oxide film is an oxide of either a transition metal or zinc.

6. The resistance change element according to claim 4, wherein the transition metal includes at least one of nickel, titanium, vanadium, manganese, iron, cobalt, copper, yttrium, zirconium, niobium, molybdenum, hafnium, tantalum, or tungsten.

7. A semiconductor memory comprising:

a transistor formed over a substrate;

a first insulation film formed over the transistor; and a resistance change element formed above the first insulation film and electrically coupled to the transistor, wherein the resistance change element includes:

a first electrode including a top surface, side surfaces and a bottom surface, the first electrode formed above the first insulation film and electrically coupled to the transistor, the side surfaces including a first side surface provided at one end of the top surface and the bottom surface and a second side surface provided at the other end of the first top surface and the bottom surface;

a second insulation film formed so as to being located above the top surface of the first electrode and being in contact with a part of the top surface of the first electrode;

a second electrode covering the first insulation film, the first side surface and the second side surface of the first electrode and the second insulation film so that an upper surface, a third side surface and a fourth side surface of the second insulation film are directly in contact with the second electrode, the third side surface provided at one end of the upper surface and the fourth end surface provided at the other end of the upper surface; and a first oxide film, including a first oxide of the first electrode, formed between the first side surface of the first electrode and a fifth side surface of the second electrode provided on the side of the third side surface, and wherein the first oxide film includes a resistance part whose resistance value changes in accordance with a voltage applied to the first and second electrodes, wherein the first oxide film is directly in contact with the first side surface of the first electrode, a fifth side surface of the second electrode and the lower surface of the second insulating film.

8. The semiconductor memory according to claim 7, further comprising:

a word line coupled to a gate of the transistor;

a ground line coupled through the transistor to the first electrode; and a bit line coupled to the second electrode.

9. The semiconductor memory according to claim 7, further comprising another second electrode.

10. The semiconductor memory according to claim 9, further comprising:

a word line coupled to a gate of the transistor;

a ground line coupled through the transistor to the first electrode;

a first bit line coupled to the second electrode; and a second bit line coupled to the another second electrode.

11. The semiconductor memory according to claim 10, further comprising:

a sense amplifier determining a logic of data read by the first bit line or the second bit line; and a switch coupling either the first bit line or the second bit line to the sense amplifier.

12. The resistance change element according to claim 1, further comprising, a second oxide film, including a second oxide of the first electrode, formed between the second side surface of the first electrode and a sixth side surface of the second electrode provided on the side of the fourth side surface, wherein the second oxide film includes a second resistance part whose resistance value changes in accordance with a voltage applied to the first and second electrodes.

13. The semiconductor memory according to claim 7, further comprising, a second oxide film, including a second oxide of the first electrode, formed between the second side surface of the first electrode and a sixth side surface of the second electrode provided on the side of the fourth side surface, wherein the second oxide film includes a second resistance part whose resistance value changes in accordance with a voltage applied to the first and second electrodes.

* * * * *